United States Patent
Ong (12)

(10) Patent No.: US 6,347,947 B1
(45) Date of Patent: Feb. 19, 2002

(54) METHOD AND APPARATUS FOR PROTECTING AND STRENGTHENING ELECTRICAL CONTACT INTERFACES

(75) Inventor: E. C. Ong, Sunnyvale, CA (US)

(73) Assignee: Advanced Interconnect Solutions, Sunnyvale, CA (US)

( * ) Notice: Subject to any disclaimer, the term of this patent is extended or adjusted under 35 U.S.C. 154(b) by 0 days.

(21) Appl. No.: 09/625,693

(22) Filed: Jul. 26, 2000

Related U.S. Application Data

(63) Continuation-in-part of application No. 09/609,626, filed on Jul. 3, 2000.

(51) Int. Cl.$^7$ .................................................. H01R 12/00
(52) U.S. Cl. ............................................................ 439/71
(58) Field of Search ........................... 439/71, 66, 67, 439/91, 591

(56) References Cited

U.S. PATENT DOCUMENTS

| | | | | |
|---|---|---|---|---|
| 5,023,698 A | * | 6/1991 | Kobayashi et al. | 357/67 |
| 5,531,022 A | * | 7/1996 | Beaman et al. | 29/850 |
| 5,810,607 A | * | 9/1998 | Shih et al. | 439/66 |
| 5,915,169 A | * | 6/1999 | Heo | 438/118 |
| 5,972,734 A | * | 10/1999 | Carichner et al. | 438/106 |
| 6,001,671 A | * | 12/1999 | Fjelstad | 438/112 |
| 6,093,584 A | * | 7/2000 | Fjelstad | 438/127 |
| 6,097,087 A | * | 8/2000 | Farnsworth et al. | 257/698 |
| 6,118,179 A | * | 9/2000 | Farnsworth et al. | 257/734 |
| 6,133,534 A | * | 10/2000 | Fukutomi et al. | 174/257 |
| 6,148,900 A | * | 11/2000 | Yamasaki et al. | 164/80 |
| 6,160,705 A | * | 12/2000 | Stearns et al. | 361/704 |

\* cited by examiner

Primary Examiner—Brian Sircus
Assistant Examiner—J. F. Duverne
(74) Attorney, Agent, or Firm—Donald R. Boys; Central Coast Patent Agency, Inc.

(57) ABSTRACT

A method for providing electrical contact to pads on a surface of a device involves steps of adding a first contact extension to individual ones of the pads, covering the pads and contact extensions with a layer of protective material, removing a portion of the layer of protective material such that a portion of each of the contact extensions is exposed, and applying a second contact extension to individual ones of the exposed first contact extensions. The first extensions may be any of several different kinds, including wires or solder balls, and the protective material layer provides both protection from environmental effects and added lateral strength for the connection of the first extensions to the contact pads.

2 Claims, 7 Drawing Sheets

Wafer Assembly

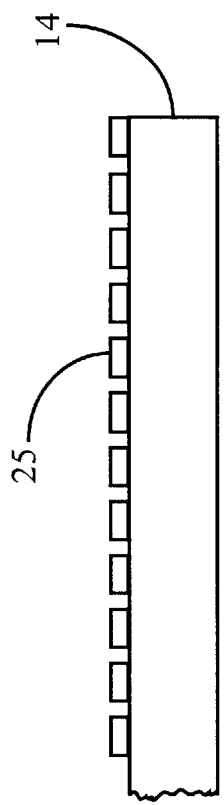
Fig. 4a
Fig. 4b
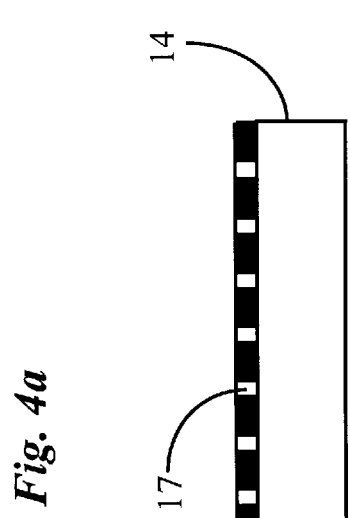
Fig. 4c
Fig. 4d
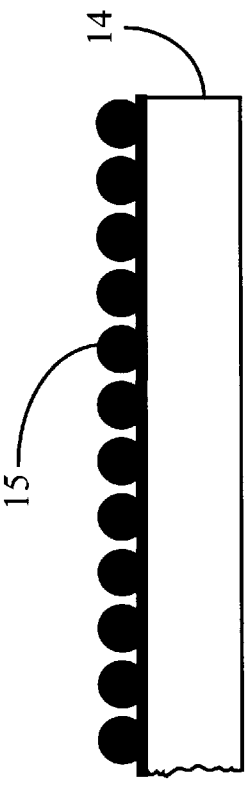
Fig. 4e

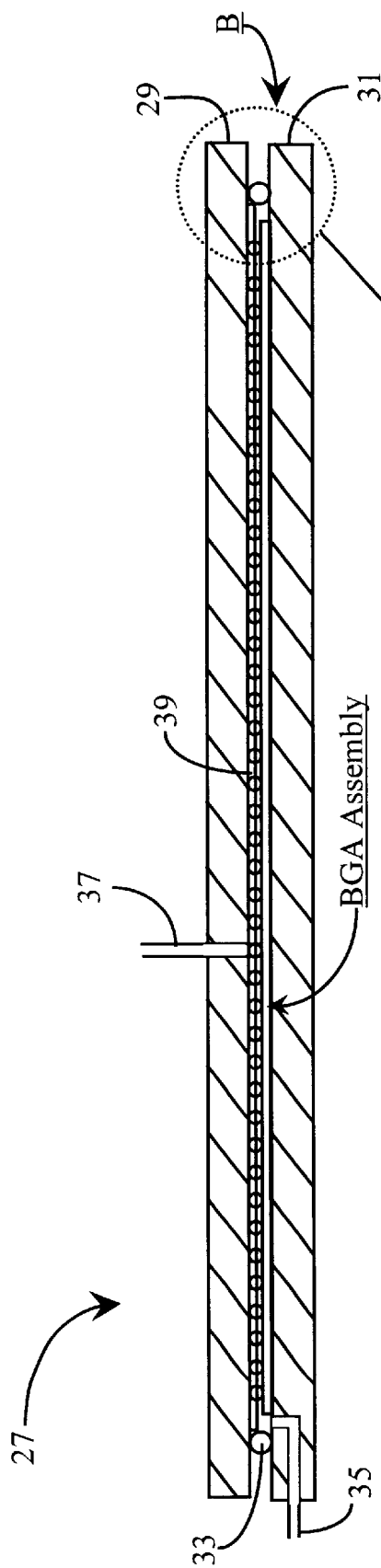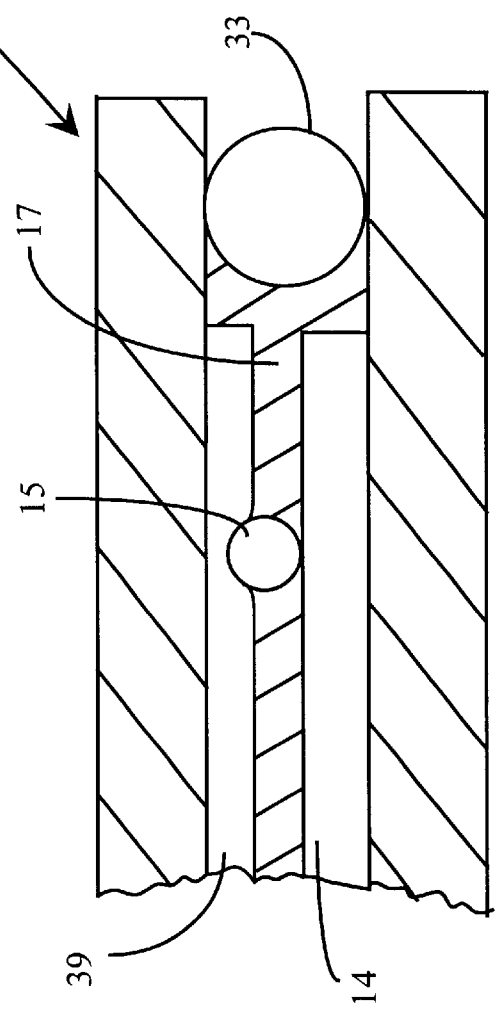
Fig. 5A
Fig. 5B

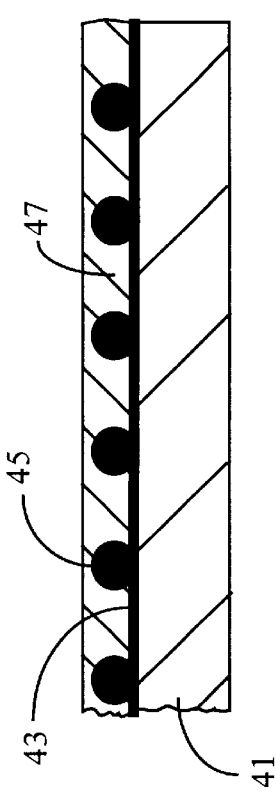
Fig. 6b
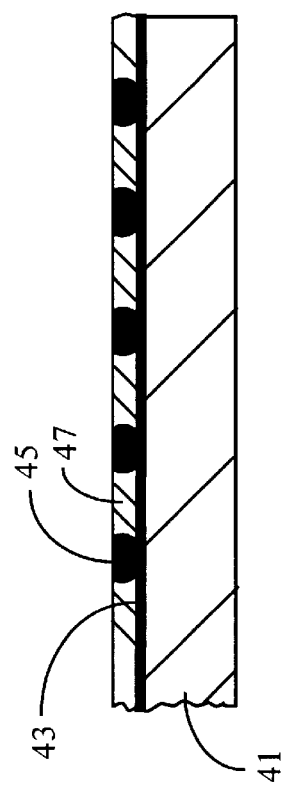
Fig. 6d
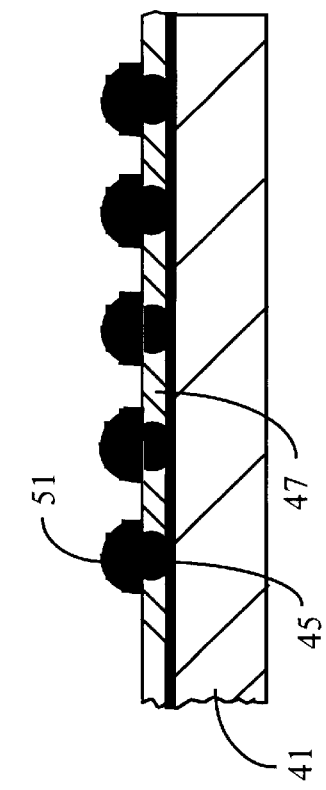
Fig. 6f
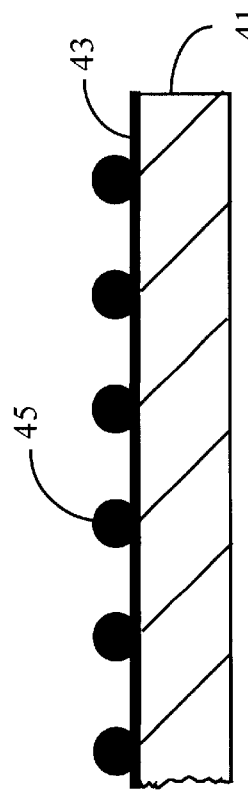
Fig. 6a
Fig. 6c
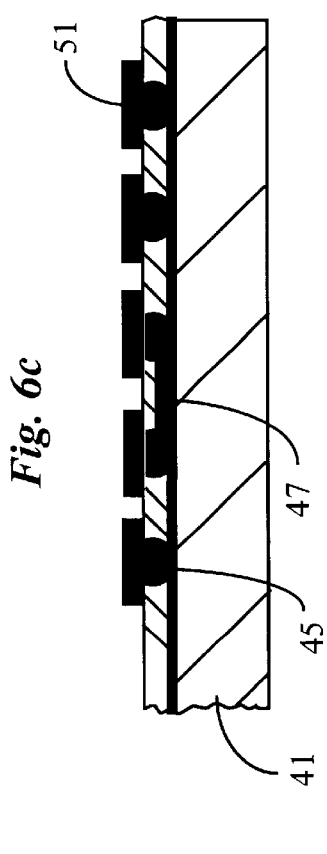
Fig. 6e

METHOD AND APPARATUS FOR PROTECTING AND STRENGTHENING ELECTRICAL CONTACT INTERFACES

CROSS-REFERENCE TO RELATED DOCUMENTS

The present application is a continuation-in-part (CIP) application to copending patent application Ser. No. 09/609,626, entitled "Method and Apparatus for Applying a Protective Over-coating to a Ball-Grid-Array (BGA) Structure", which was filed on Jul. 3, 2000, and which is incorporated herein in its entirety.

FIELD OF THE INVENTION

The present invention is in the field of semiconductor and printed-circuit-board (PCB) manufacturing including surface mount technologies (SMT), and pertains more particularly to methods and apparatus for applying protective coatings to structures meant for connection by BGA and other techniques.

BACKGROUND OF THE INVENTION

The field of integrated circuit interconnection and packaging is one of the most rapidly-evolving technologies associated with semiconductor manufacturing. As demand for devices that are smaller and more powerful continues to increase, pressures are put on manufacturers to develop better and more efficient ways to assemble and package IC products. One of the more recently developed methods for assembling and packaging IC products is known as Ball-Grid-Array (BGA) technology. Motorola™ inc. is one of the noted pioneers of BGA technology. Currently there are many companies that license BGA technology developed by Motorola™, and Motorola™ and other companies continue to develop BGA technology.

BGA technology provides several advantages over more mainstream technologies such as Fine-Pitch-Technology (FPT), and Pin-Grid-Array (PGA). One obvious advantage is that there are no leads that can be damaged during handling. Another obvious advantage is that the solder balls are typically self-centering on die pads. Still other advantages are smaller size, better thermal and electrical performances, better package yields, and so on.

In BGA technology, wafers or substrates are typically protected with a non-conductive material such as a nitride layer. The die pads are exposed through the nitride layer by means of chemical etching, or by other known methods. The protective nitride layer is intended to protect the substrates from contaminants and damage. One problem with prior-art protective coatings such as a nitride layer is that it is ultra-thin and does not offer any protection to the die pads themselves nor to the connection points between solder balls in the die pads.

It has occurred in the inventor that an additional protective coating, such as a protective polymer-based coating, would offer a measure of protection not provided with prior-art coatings. For example, it is desired that in addition to protecting the substrates itself, die pads and soldered connections may also benefit logically from protection. However, in order to obtain the added, protective benefits from an additional coating, a unique application process must be conceived. It is to such a process that the method and apparatus of the present invention is directed.

In the development of protective coating technology for BGA devices and other contact schemes the inventors have also discovered that a similar technique also provides vastly increased lateral strength for connections made to connection pads on BGA assemblies and other sorts of devices wherein connection extensions to pads are necessary.

Accordingly, what is clearly needed is a method and apparatus for applying a protective overcoat to a devices after adding contact extensions such that exposed die-pad areas, soldered connections, and exposed areas of solder balls in the assembly are protected from exposure, and the contact interfaces are strengthened.

SUMMARY OF THE INVENTION

In a preferred embodiment of the present invention a method for providing electrical contact to pads on a surface of a device is provided, comprising the steps of (a) adding a first contact extension to individual ones of the pads; (b) covering the pads and contact extensions with a layer of protective material; (c) removing a portion of the layer of protective material such that a portion of each of the contact extensions is exposed; and (d) applying a second contact extension to individual ones of the exposed first contact extensions.

In a preferred embodiment of the invention the first contact extensions are one of solder or wire extensions. Also, the protective material may be applied by one of screening, spraying, dispense and spinning, or injection into a mold, and removal may be by one of physical machining or etching. In preferred embodiments the second extension is of the same material as the first extension, and a contiguous interface is provided. In some instances the first extension is a solder ball, providing a ball-grid array (BGA), and in some instances the second extension is also a solder ball.

In another aspect of the invention an electrical contact system is provided, comprising a first surface of a device having electrical contact pads; a first contact extension bonded to individual ones of the pads at a first interface; a layer of protective material encapsulating the first interfaces and at least a portion of the first extensions; and a second contact extension bonded to individual ones of the first contact extensions. In some embodiments the first contact extensions are one of solder or wire extensions, and the protective material is a polymer material. Further, the second extension may be of the same material as the first extension, and a contiguous interface is provided.

In some embodiments of the invention the first extension is a solder ball, providing a ball-grid array (BGA), and in some embodiments the second extension may also be a solder ball.

In embodiments of the present invention taught in enabling detail below, for the first time a method and apparatus is provided for protecting and strengthening vulnerable electrical contacts made to contact pads on many electronic devices.

BRIEF DESCRIPTION OF THE DRAWING FIGURES

FIG. 4 is a process diagram illustrating processing steps a through e for coating and creating die pad openings according to another embodiment of the present invention.

FIG. 5A is a section view of a vacuum enhanced coating apparatus for applying a protective overcoat to a BGA assembly according to a preferred embodiment of the present invention.

FIG. 5B is a detailed view of a portion of FIG. 5A.

FIGS. 6a–f illustrates a series of steps in practicing the present invention.

Figure 7:
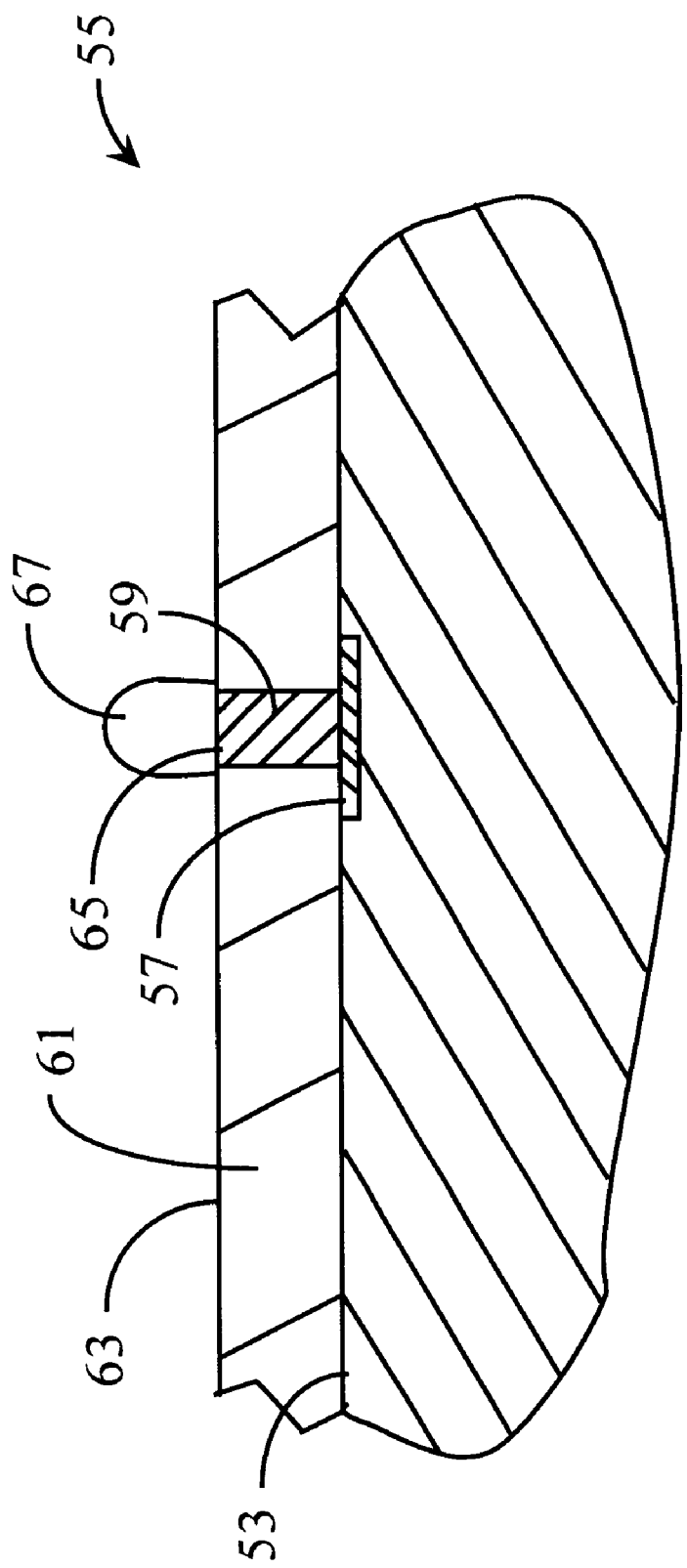

FIG. 7 illustrates a general case of adding contact extensions to contact pads in an embodiment of the present invention.

DESCRIPTION OF THE PREFERRED EMBODIMENTS

Figure 1B:
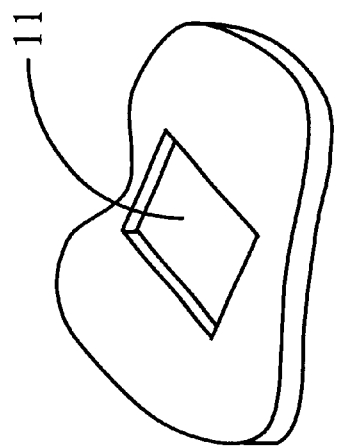
FIG. 1B is an expanded and broken view of the wafer of FIG. 1A illustrating a die-pad exposed through a nitride coating.
Figure 1A:
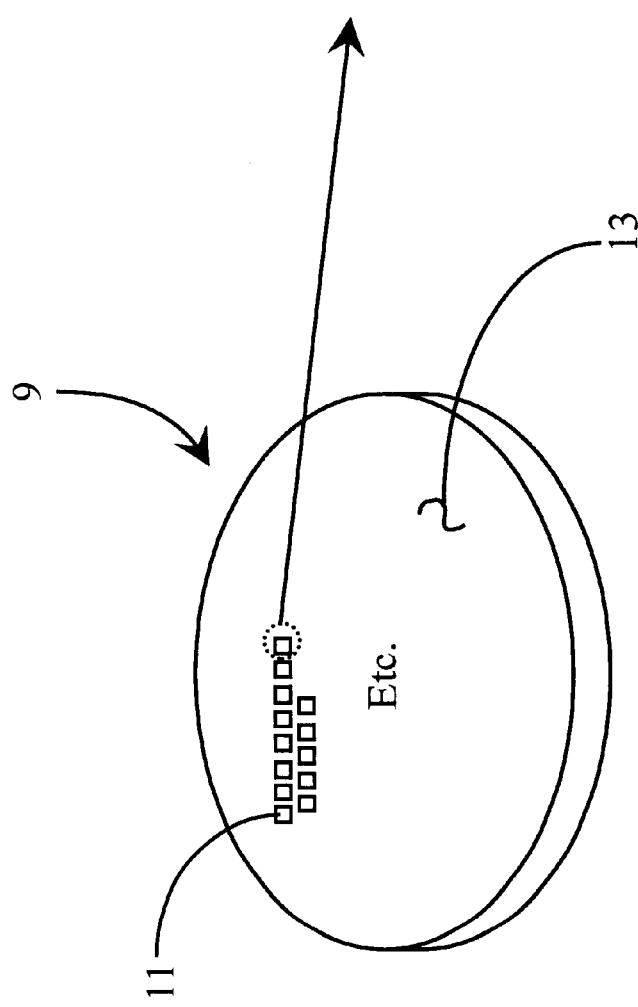
FIG. 1A is a perspective view of a wafer with die pads according to prior art.

FIG. 1A is a idealized perspective view of a coated wafer 9 with die pads 11 according to the prior art art. The skilled artisan will recognize that the pads have been very much exaggerated in this view to be able to provide some detail. In this example of prior art wafer 9 is coated with a thin, protective layer that is nonconductive, such as a nitride layer 13. Die pads 11 are illustrated in an array on wafer 9. Typically, die pads 11 are nitride coated along with wafer 9, which may be a rectangular substrate instead of an actual wafer. After nitride coating, die pads 11 are exposed by such as an etching process.

FIG. 1B is an expanded and broken view of one pad 11 of FIG. 1A, shown in perspective, illustrating the pad exposed through the nitride layer. In this detail, a die pad 11 can be seen recessed beneath the thickness of nitride coating 13. It is noted herein, that die pad 11 is completely exposed, meaning that there is no protective layer above any of the land occupied by die pad 11. When a solder ball (not shown) is placed on die pad 11, certain real estate of die pad 11 along with the soldered area between the ball and die pad 11 will be exposed, and therefore vulnerable to damage and contamination. A goal of the present invention is to provide a process that according to various embodiments, which are described in enabling detail below, may be used to successfully apply a protective coating layer in addition to the standard hard protective layer such as the nitride layer described above.

Figure 2:
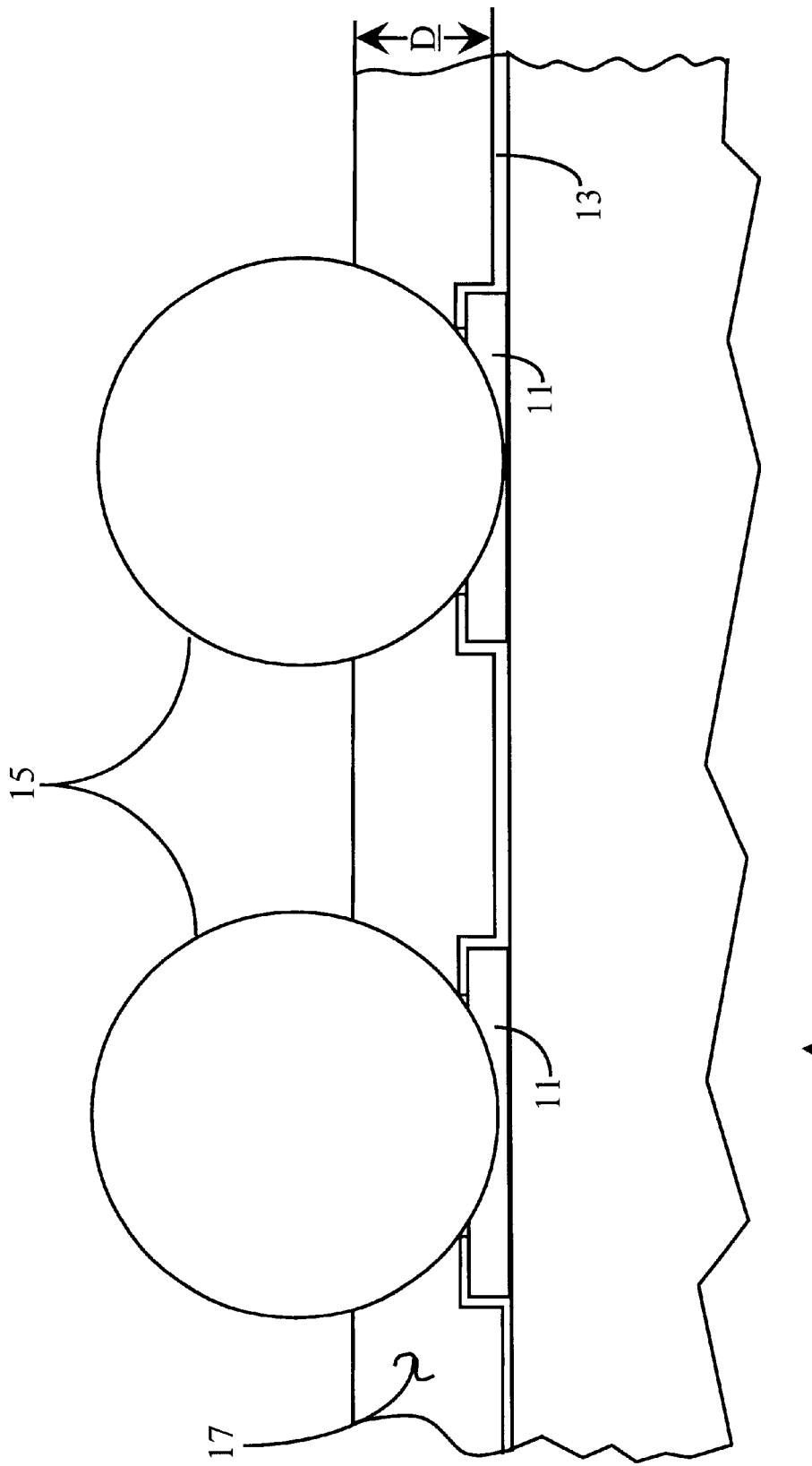
FIG. 2 is a broken view of a BGA assembly with a protective overcoat according to an embodiment of the present invention.

FIG. 2 is a broken view of a portion of a BGA assembly 14 with a protective overcoat 17 according to an embodiment of the present invention. In this example of the present invention, BGA assembly 14 exhibits two die pads 11 having solder balls 15 adhered thereto. A protective coating 17 is, in a preferred embodiment, a polymer-based coating such as a polyamide coating. In other embodiments, other polymer-based coatings may be used such as are known in the art and available to the inventor. This example illustrates a preferred embodiment, wherein protective coating 17 coats the substrate and the normally exposed area of each die pad 11 around solder balls 15 and also around the perimeter of each solder ball 15.

A nitride coating 13, which is illustrated in FIGS. 1A and B, is illustrated here as coating the substrate portion of assembly 14 with the coating extending up over the attached die pads. It may be assumed herein, that a portion of coating 13 has been removed by any one of several known methods in order to clear to an appropriate area on the upper surfaces of each die pad 11 for placement and reflow of solder balls 15. Protective coating 17 is illustrated as over coating nitride layer 13 and encompassing the lower peripheral areas of solder balls 15. A height dimension D illustrates the thickness of coating 17, which may be anywhere from 1 to 3 mils thick in a preferred embodiment. Overcoat 17 functions to protect any exposed pad areas as well as a portion of solder balls 15.

Figure 3A:
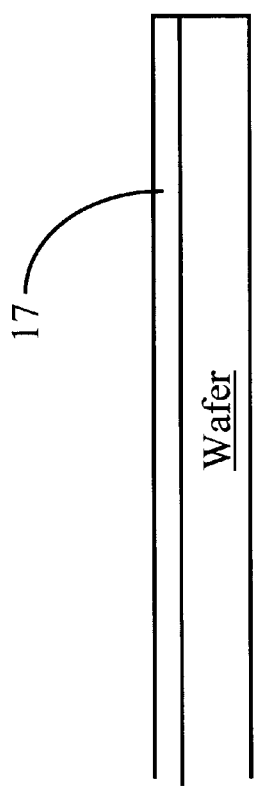
FIG. 3A is a plan view of the wafer of FIG. 2 with a protective overcoat applied as a first step according to an embodiment of the present invention.
Figure 3B:
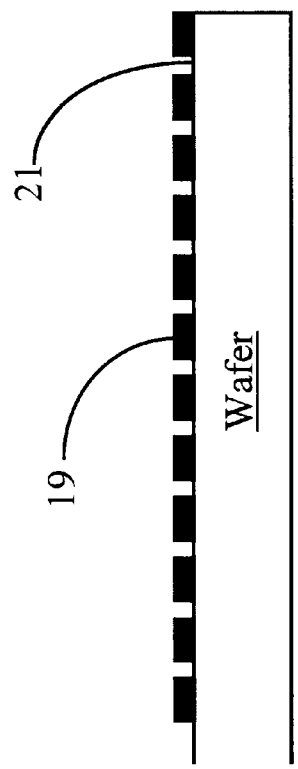
FIG. 3B is a plan view of the coated wafer of FIG. 3A with coated areas removed in areas to expose the die pads.
Figure 3C:
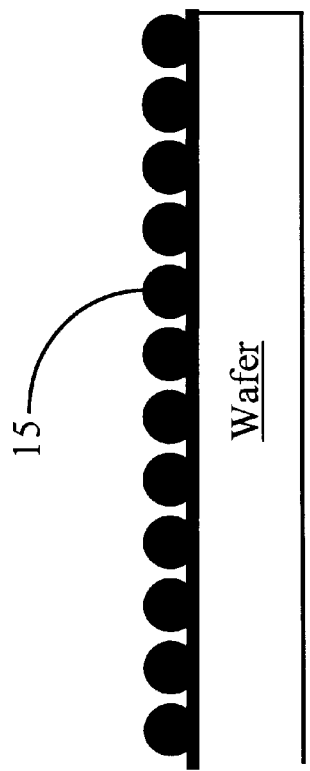
FIG. 3C is a plan view of the coated wafer of FIGS. 3A and 3B with solder balls place according to a third step.

In practice of the present invention, the inventor has isolated three basic processes that are useful to successfully apply protective coating 17 to BGA assembly 14. FIG. 3A is a plan-broken view of wafer 14 of FIG. 2 with a protective overcoat applied as a first step according to an embodiment of the present invention. FIG. 3B is a plan-broken view of coated wafer 14 of FIG. 3A undergoing a process to expose covered die pads in a second step. FIG. 3C is a plan-broken view of coated wafer 14 of FIG.'S 3A and 3C with solder balls in place according to a third step. The examples of FIG. 3A, 3B, and 3C illustrate a general 3-part process for the over coating wafer 14, removing material to expose die pads, and then screening the solder balls into place for a re-flow operation.

Referring now to FIG. 3A, wafer 14 is illustrated with protective coating 17 already applied. It may be assumed herein, although not specifically illustrated, that die pads 11 of FIG. 2 and nitride coating 13 of FIG. 2 are present on wafer 14 before application of protective coating 17. Coating 17 in a first step completely covers die pads 11 and nitride coating 13. Coating 17 may be a Polyamide coating or a similar polymer-based coating as described above. Coating 17 may be applied by any one of several processes, such as by vacuum deposition process, a spin-on process, or by virtue of other known methods.

Referring now to FIG. 3B, protective coating 17 is partially removed over the land areas above each die pad attached to wafer 14. This process may be a laser process, a plasma-etch process, or a chemical-etch process. In both the plasma-etch and chemical-etch processes, a mask is used to protect portions of coating 17 not covering die pads. These portions are represented herein by element number 19. Areas where material has been removed are represented herein by element number 21. Once die pads are exposed, they are ready to accept solder balls.

Referring now to FIG. 3C, wafer 14 is illustrated with solder balls 15 screened in place and ready to be re-flowed onto the associated die pads. A re-flow process uses heat to effect the solder connections between balls 15 and associated die pads. The process described above with respect to FIGS. 3A–3C may be used to according to one embodiment, to protect any BGA assembly.

FIG. 4 is a process diagram illustrating processing steps a through e for coating and creating die pad openings according to another embodiment of the present invention. In step a, wafer 14 is coated with a photoresist coating represented herein by element number 23. As described in FIG. 3A above, it may be assumed that die pads (11) and a standard nitride layer (13) are present in this step. This photoresist process may be accomplished using a standard screen-printing technique. It is noted herein that photoresist 23 is applied before applying a protective coating (17).

In step b, a masking technique is used to cover areas of photoresist that are directly over die pads (11). Through development of photoresist (23) with a protective mask applied, resist islands are formed as represented by element number 25 in this step. Resist islands 25 are present areas of photoresist left directly over die pads (11) after developing.

In step c, protective coating 17 is applied at substantially the same thickness as photoresist 25. This process of coating fills in the areas in-between resist islands 25, such areas representing real estate of wafer 14 not occupied by a die pad (11).

In step d, a second masking technique is used to protect the areas coated with protective coating 17 in step c. At this point in the process, resist islands 25 are chemically developed, and then etched away exposing associated die pads (11) leaving all other real estate untouched. In step e, solder balls 15 are screened in place over die pads (11) as described with reference to FIG. 3C. At this point of the process, a re-flow operation to permanently attach solder balls 15 to die pads (11) may begin. The process represented herein by FIG. 4, illustrates a process for applying protective coating 17 according to yet another embodiment of the present invention.

FIG. 5A is a section view of a vacuum-application and coating apparatus 27 for applying protective overcoat 17 to a BGA assembly according to a preferred embodiment of the present invention. Vacuum-application and coating apparatus 27, hereinafter referred to as simply apparatus 27, is provided and adapted to enable an automated coating process to be performed on a BGA assembly after re-flow. Apparatus 27 comprises an upper plate 29, a lower plate 31, and a vacuum seal 33. In a preferred embodiment both plate 29 and 31 are manufactured of stainless-steel or other durable metals. Plates 29 and 31 may be circular, or rectangular in shape. Other shapes may be employed as well.

In operation a BOA assembly 32, with solder balls in place, is enclosed by plate 29 and 31 fitted together using a seal 33. It may be assumed herein that either plate 29 or plate 31 has an o-ring-style groove provided on its mating surface, generally around the perimeter, such that seal 33 may be properly retained and facilitated. In one embodiment, both mating surfaces of plates 29 and 31 may be grooved to facilitate seal 33. In still another embodiment, a metallic sealing apparatus may be used instead of an o-ring.

Plate 29 and 31 are fitted together over seal 33 to form apparatus 27, and the plates may be held together by any of several methods, such as by bolts or by clamp mechanisms. A chamber formed within apparatus 27 after assembling contains at least one BGA assembly. In one embodiment, many BGA assemblies may be introduced into the formed chamber for processing. The height of an internal processing area formed within apparatus 27 after assembly is sufficient to accommodate the height of a BGA assembly without damaging the assembly.

Plate 29 has a compliant layer of material, illustrated herein as compliant layer 39 affixed thereto and covering the area over the ball array of an enclosed part. This compliant layer 39 may be a rubberized material, a polymer-based material, or any other suitable material having compliant characteristics. The purpose of compliant layer 39 on plate 29 is to protect the upper portions of solder balls (15) of a BGA assembly or assemblies inserted into apparatus 27 for processing. The dimensions of the plates are such that, when the plates are closed, the compliant layer forms over the upper portion of each solder ball as may be seen in FIG. 5B.

Upper plate 29 has an injection port 37 provided therethrough, which opens into the vacuum chamber formed within apparatus 27. Port 37 is adapted to enable injection of an uncured protective coating material 17, in liquid form, into the vacuum chamber during processing. In one embodiment, there may be more than one injection port 37 provided within plate 29. Lower plate 31 has a vacuum port 35 providing therethrough, which opens into the vacuum chamber formed within apparatus 27. Port 35 is adapted to connect a vacuum pumping apparatus (not shown) to enable a vacuum to be drawn within apparatus 27. In one embodiment, there may be more than one vacuum port provided within plate 31.

In practice of the present invention, at least one BGA assembly complete with re-flowed solder balls is placed onto the surface of plate 31. Plate 29 is urged into to plate 31 over seal 33 and bolted or clamped together with the BGA assembly or assemblies inside. A vacuum is then drawn by virtue of port 35. The protective coating 17 is injected through port(s) 37 to the internal chamber coating the inserted BGA assembly or assemblies.

FIG. 5B is an expanded view of one edge of the assembly shown in FIG. 5A. In this expanded view, wafer 14 is shown with one solder ball 15. Compliant layer 39 forms over the top of solder ball 15 and protects the covered area of ball 15 from being coated with injected coating 17, in a manner that, when released, the solder balls will be exposed on the coated parts. The top surface of solder ball 15 is required to be free of coating as this area is used for lead connection. However, the remaining real estate of wafer 14 and solder ball 15 is covered with protective coating 17 during this back-filling operation. After back-filling with the protective coating material in liquid form, the material is cured before the molds are opened.

It will be apparent to one with skill in the art that apparatus 27 may be manufactured of a size such as to facilitate the processing of a number of BGA assemblies simultaneously. In one embodiment apparatus 27 may process only a few assemblies, or perhaps one assembly at a time. Once processing is completed within apparatus 27, BGA assemblies are removed from apparatus 27 by unbolting or unclamping apparatus and pulling apart plates 29 and 31 revealing completed BGA assemblies. A tracking operation may be used to remove excess coating.

In yet another embodiment of the invention a method is provided for protecting a BGA assembly in a manner that increased strength is also provided. This method is illustrated herein with the aid of FIGS. 6a through 6f. FIG. 6a illustrates a wafer 41 with balls 45 placed and soldered to solder pads, with a nitride layer 43 in place, as is known in the art. FIG. 6b shows the assembly of FIG. 6a with a protective layer 47 applied according to embodiments to the present invention as described above. Layer 47 may be applied by screening, spraying, dispense and spinning, by backfilling, or in any of several other ways. Preferably, layer 47 completely covers all balls in the ball grid array.

In FIG. 6c a machining operation is illustrated using a grinding or cutting wheel 49 to remove a portion of layer 47 and enough of each ball in the ball grid array that each ball is now exposed as a flat pad even with the upper machined surface of layer 47. FIG. 6d shows the assembly of FIG. 6c completely planarized.

After planarization, solder material is applied over each exposed solder ball machined surface. FIG. 6e illustrates a solder pad 51 in place over each solder ball in the assembly. Solder islands 51 may be applied by screen printing paste, by plating, or by direct solder ball attachment. Preferably the new solder material may have a melting point equal to that of the original solder balls, or a lower melting point.

After the new solder material is applied, that material is re-flowed, such that the new ball grid array surface is created over the original. The original solder balls are now completely encapsulated in the material of layer 47, and the original wafer surface and all of the elements of that surface are very well protected. Additionally, the new array is much more robust and strong than the original, because all stress points have now been redistributed away from the wafer surface.

In the embodiments described above, ball-grid-array (BGA) applications have been emphasized and used as examples. The invention in its various aspects, however, has application far beyond BGA assemblies, and is broadly applicable to all situations wherein electrical attachment needs to be made to specific areas on any surface. Attachment by solder balls in BGA technology is described above, but attachment may also be made by other means, such as by wire bonding in many instances. The methods are not limited to wafer and die surfaces, either, and may be applied to printed circuit boards of various kinds and other electronic connection schemes as well.

Broadly speaking, in any case where contact areas are exposed for attaching electrical connections the present invention has application. FIG. 7 illustrates perhaps the broadest case. In FIG. 7 a surface 53 of a device 55 has one or more connector pad areas 57, to which electrical connection needs to be made. One such connector area is shown, but there may of course be many more, as in BGA technology. One however, is sufficient to practice the present invention.

In this broad example, pad 57 is typically of a material that can be applied by a deposition technique, and the material that must be used for a connecting extension 59 is typically of a different material. In the case of BGA technology extension 59 is solder material, Because of this, the interface of the two materials at pad 57 is not capable of sustaining significant horizontal stress, and this leads to many physical failures. In the example shown, extension 59 is made just as in the prior art, and may be a solder ball, a gold wire, or some other sort of contact extension.

In the present invention, after contact extension 59 is applied, a polymer protective and strengthening material 61 is applied, which may be done by any one of several methods as have been described in the present application above. Typically material layer 61 is applied to a thickness such that extensions 59 are completely encapsulated, then a removal technique is employed to planarize surface 63, exposing extension 59 again. The result of this step is a planarized surface 63 with new contact areas 65.

In a final step a new contact extension 67 added to contact area 65, and this extension can now typically be of the same material as extension 59, such that the juncture at area 65 may be of contiguous material, making a very strong juncture, as opposed to the weak juncture at pad 57. The weak juncture at pad 57, however, is now encapsulated by layer 61, and thus greatly strengthened.

In summary, by adding an extension to pads 57, even though the interface between the extension and the pad may be fairly weak, then adding a polymer layer 61, the weak juncture can be strengthened. Then new extensions can be added with an interface that is much stronger then the original, providing thereby a very much more durable mechanism, while at the same time protecting the original surface and interfaces from environmental effects.

It will be apparent to one with skill in the art that the method and apparatus of the present invention may be provided for a wide variety of shapes and sizes of BGA assemblies without departing from the spirit and scope of the present invention. Similarly, the method and apparatus of the present invention may be applied to BGA assemblies of varying materials. The method and apparatus of the present invention provides an automated and efficient way to apply an additional protective coating to BGA assemblies. The method and apparatus of the present invention should be afforded the broadest scope possible under examination. The spirit and scope of the present invention should be limited only by the claims that follow.

What is claimed is:

1. An enhanced ball-grid array (BGA) integrated circuit (IC), comprising:

a plurality of die-attach pads open to a first surface of the IC to provide electrical signal communication to and from the IC;

a plurality of first solder balls, individual ones of the first solder balls metallurgically bonded to individual ones of the die-attach pads at the first surface;

a layer of protective polymeric material over and adhering to the first surface, encapsulating that portion of the die-attach pads not bonded to the first solder balls, and at least a portion of the first solder balls, leaving a portion of the first solder balls exposed; and a plurality of second solder balls, individual ones of the second solder balls metallurgically bonded to individual ones of the first solder balls at the portions left exposed;

characterized in that the second solder balls present a BGA interface for the IC, and in that the layer of protective polymeric material provides lateral support for the metallurgical bonds between the first solder balls and the die-attach pads.

2. The IC of claim 1 wherein the metallurgical bond at the die attach pads is a bond between solder and a non-solder material, and the metallurgical bond between the first and the second solder balls is a bond between solder materials.

* * * * *